United States Patent
Nagasawa et al.

(10) Patent No.: US 6,990,614 B1
(45) Date of Patent: Jan. 24, 2006

(54) DATA STORAGE APPARATUS AND DATA MEASURING APPARATUS

(75) Inventors: Hidekazau Nagasawa, Tokyo (JP); Teruhiko Funakura, Tokyo (JP); Kazushi Sugiura, Hyogo (JP); Hisaya Mori, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 890 days.

(21) Appl. No.: 09/641,352

(22) Filed: Aug. 18, 2000

(30) Foreign Application Priority Data

Feb. 25, 2000 (JP) .............................. 2000-049150

(51) Int. Cl.
*G06F 11/00* (2006.01)

(52) U.S. Cl. ........................................ 714/701; 714/724

(58) Field of Classification Search .................. 710/65, 710/106; 714/724, 719, 738, 701; 395/500; 324/753; 380/8, 50, 210; 707/101; 369/47.34; 211/217; 382/162
See application file for complete search history.

(56) References Cited

U.S. PATENT DOCUMENTS

| | | | |
|---|---|---|---|
| 4,680,791 A * | 7/1987 | Kato et al. ...................... 380/8 |
| 5,410,677 A * | 4/1995 | Roskowski et al. ............ 710/65 |
| 5,550,987 A * | 8/1996 | Tanaka ........................ 710/106 |
| 5,610,925 A * | 3/1997 | Takahashi .................... 714/724 |
| 5,850,452 A * | 12/1998 | Sourgen et al. ................ 380/50 |
| 5,970,236 A * | 10/1999 | Galloway et al. ........... 395/500 |
| 6,032,147 A * | 2/2000 | Williams et al. ............ 707/101 |
| 6,035,044 A * | 3/2000 | Itoi ............................. 380/210 |
| 6,154,862 A * | 11/2000 | Tabata et al. ................ 714/719 |
| 6,157,200 A * | 12/2000 | Okayasu ...................... 324/753 |
| 6,272,084 B1 * | 8/2001 | Maeda .................... 369/47.34 |
| 6,282,310 B1 * | 8/2001 | Kadowaki ................... 382/162 |
| 6,389,525 B1 * | 5/2002 | Reichert et al. ............. 711/217 |

* cited by examiner

*Primary Examiner*—David Ton
(74) *Attorney, Agent, or Firm*—McDermott Will & Emery LLP

(57) ABSTRACT

A data storage apparatus comprising a scrambling circuit 34 for converting address signals and error data output by a tester 24 to a desired format, and a storage device 28 for storing the converted data. The scrambling circuit 34 includes a plurality of conversion circuits 40, 42 and 44 each converting the signals from the tester 24 according to different rules, and a selector 46 for selecting one of signals output by the conversion circuits 40, 42 and 44 and for supplying what is selected to the storage device.

9 Claims, 8 Drawing Sheets

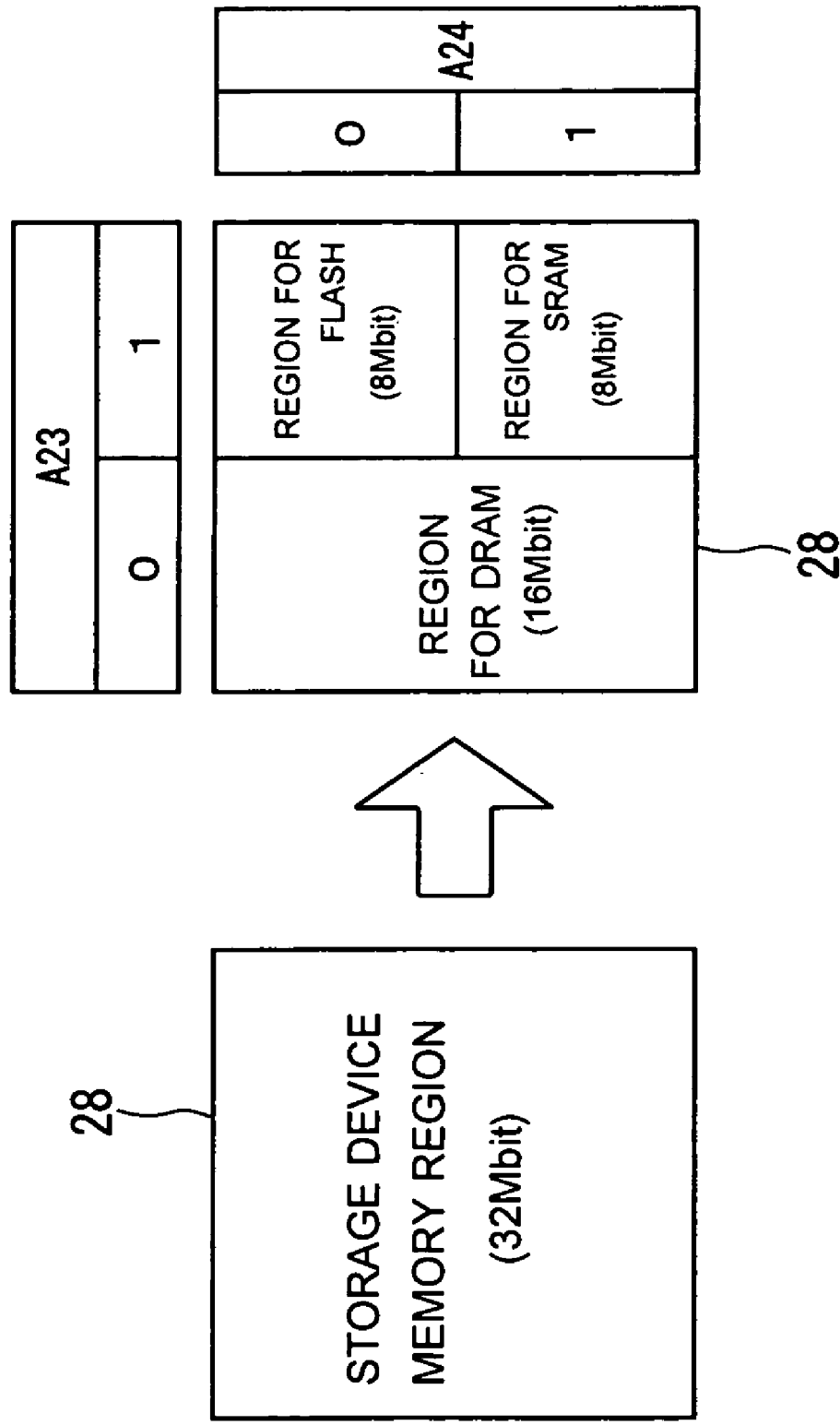

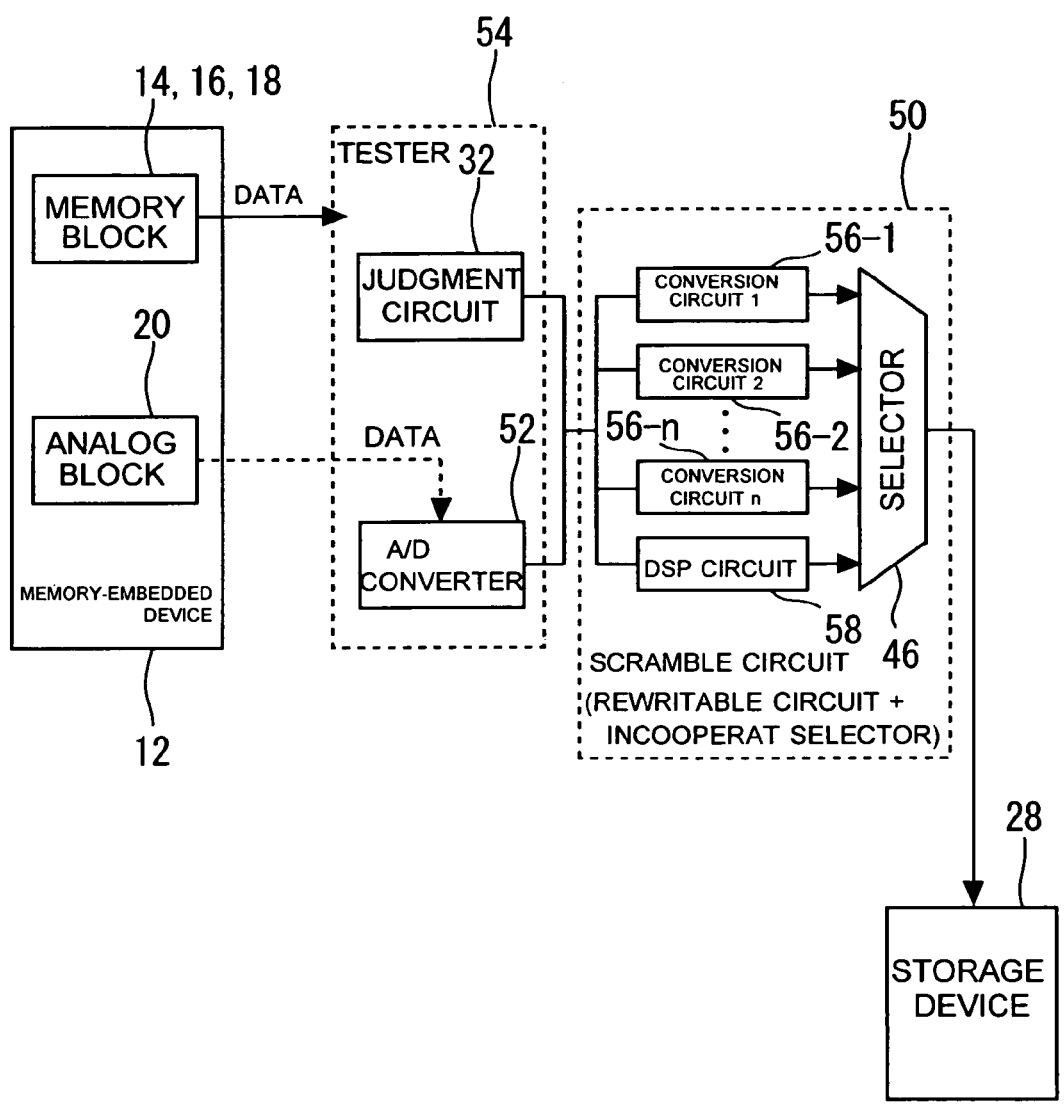

DATA STORAGE APPARATUS AND DATA MEASURING APPARATUS

BACKGROUND OF THE INVENTION

1. Field of the Invention

The present invention relates to a data storage apparatus and a data measuring apparatus. More particularly, the invention relates to a data storage apparatus and a data measuring apparatus suitable for analyzing a semiconductor device that incorporates a plurality of function blocks for implementing specific functions.

2. Description of the Background Art

FIG. 8 is a block diagram of a conventional data measuring apparatus 10 and a memory-embedded device 12 connected to the apparatus 10. The memory-embedded device 12 is a semiconductor device incorporating a plurality of function blocks. In FIG. 8, the device 12 comprises an SRAM block 14 functioning as a static random access memory (SRAM), a DRAM block 16 acting as a dynamic random access memory (DRAM), a flash block 18 working as a flash memory, an analog block 20 composed of a relevant analog circuit, and a logic block 22 made of a suitable logic circuit.

The data measuring apparatus 10 is constituted by a tester 24, a scrambling circuit 26, and a storage device 28. Inside the tester 24 are a pattern generator 30 that generates test patterns necessary for analyzing the memory-embedded device 12, and a judging circuit 32 that judges whether the device 12 is functioning normally.

More specifically, the pattern generator 30 supplies the memory-embedded device 12 with address signals and a variety of input data for determining locations of parts under test. Furthermore, the pattern generator 30 feeds the scrambling circuit 26 with the same addresses sent to the memory-embedded device 12, and supplies expected values to the judging circuit 32 for data judgment purposes.

Relevant data are written as requested by the pattern generator 30 to memory cells constituting the SRAM block 14, DRAM block 16, or flash block 18 in the memory-embedded device 12. The data thus written to the memory cells are retrieved as requested by the pattern generator 30 and sent to the judging circuit 32. In turn, the judging circuit 32 compares the output signal from the memory-embedded device 12 with an expected value for data judgment to see if the device 12 is functioning normally. The result of the judgment is fed to the scrambling circuit 26.

The scrambling circuit 26 converts addresses sent from the pattern generator 30 according to suitable rules, and processes error data or the like from the judging circuit 32 in accordance with relevant rules. After such conversion and processing, the scrambling circuit 26 sends the converted address signals and the processed error data to the storage device 28. As a result, the processed error data or the like are stored at those locations in the storage device 28 which are identified by the converted address signals.

Generally, the plurality of memory blocks incorporated in the memory-embedded device 12 are each addressed by a specific addressing method. These memory blocks usually have a different memory size each. This means that if the address signals from the pattern generator 30 are sent unmodified to the storage device 28 so as to identify data storage locations therein, it will be impossible to store efficiently the data about the multiple memory blocks of the different types.

The scrambling circuit 26 is designed to store efficiently into the storage device 28 the data about the multiple memory blocks. Depending on the type of memory block under test, the scrambling circuit 26 produces a plurality of states in which to convert address signals and to process error data or the like according to relevant rules. More specifically, the scrambling circuit 26 establishes one of three settings A, B and C in accordance with an externally supplied switching signal. Bringing the setting A, B or C into effect allows the data about the SRAM block 14, DRAM block 16 or flash block 18 to be stored efficiently. The data measuring apparatus 10 alters the settings of the scrambling circuit 26 in such a manner that the status of the memory-embedded device 12 housing a plurality of memory device may be measured continuously and that the measurements may be stored efficiently into the storage device 28.

The conventional scheme above has a number of disadvantages. It takes at least several microseconds for the scrambling circuit 26 to have its settings switched. In fact, actually altering the circuit settings requires a longer stop time due to a processing of setting information other than the several microseconds. Semiconductors are usually tested at intervals of tens of nanoseconds. This makes it impossible for the conventional scrambling circuit 26 to have its settings modified in real time while a semiconductor device is being tested.

The conventional scrambling circuit 26 has its workable settings determined in advance. It follows that this type of scrambling circuit 26 is not suitable for general-purpose use with diverse kinds of semiconductor devices. Although the versatility of the scrambling circuit 26 could be enhanced by preparing a large number of settings that may be established, the preparation would require increasing the number of pins needed for the switchover involved. This imposes certain constraints on the practice of furnishing numerous pins beforehand to provide many viable settings.

SUMMARY OF THE INVENTION

It is therefore a first object of the present invention to overcome the above and other deficiencies and disadvantages of the prior art and to provide a data storage apparatus and a data measuring apparatus comprising a scrambling circuit capable of altering in real time the settings corresponding to a plurality of function blocks.

It is a second object of the present invention to provide a data storage apparatus and a data measuring apparatus comprising a scrambling circuit capable of having its workable settings determined in content and type as needed according to specifications of a semiconductor device under test.

The above objects of the present invention are achieved by a data storage apparatus described below. The data storage apparatus includes a scrambling circuit for converting an input signal to a desired format, and a storage device for storing converted data. The scrambling circuit includes a plurality of conversion circuits each converting the input signal according to different rules. The scramble circuit also includes a selector for selecting one of signals output by the plurality of conversion circuits and supplying what is selected to the storage device.

The above objects of the present invention are also achieved by a data storage apparatus described hereunder. The data storage apparatus includes a scrambling circuit for converting an input signal to a desired format, and a storage device for storing converted data. The scrambling circuit is constituted by a rewritable device.

The above objects of the present invention are further achieved by a data measuring apparatus including the data storage apparatus described above as well as a tester for testing a semiconductor device and for supplying the scrambling circuit with results of the testing.

Other objects and further features of the present invention will be apparent from the following detailed description when read in conjunction with the accompanying drawings.

BRIEF DESCRIPTION OF THE DRAWINGS

FIGS. 3A and 3B are schematic views of a memory area in a storage device included in the semiconductor analyzing apparatus practiced as the first embodiment, and a typically segmented memory area of the storage device;

FIG. 5 is a block diagram of a data measuring apparatus practiced as a third embodiment of this invention, and a memory-embedded device connected to the apparatus;

FIG. 1 is . . . ;

DESCRIPTION OF THE PREFERRED EMBODIMENTS

Figure 1:
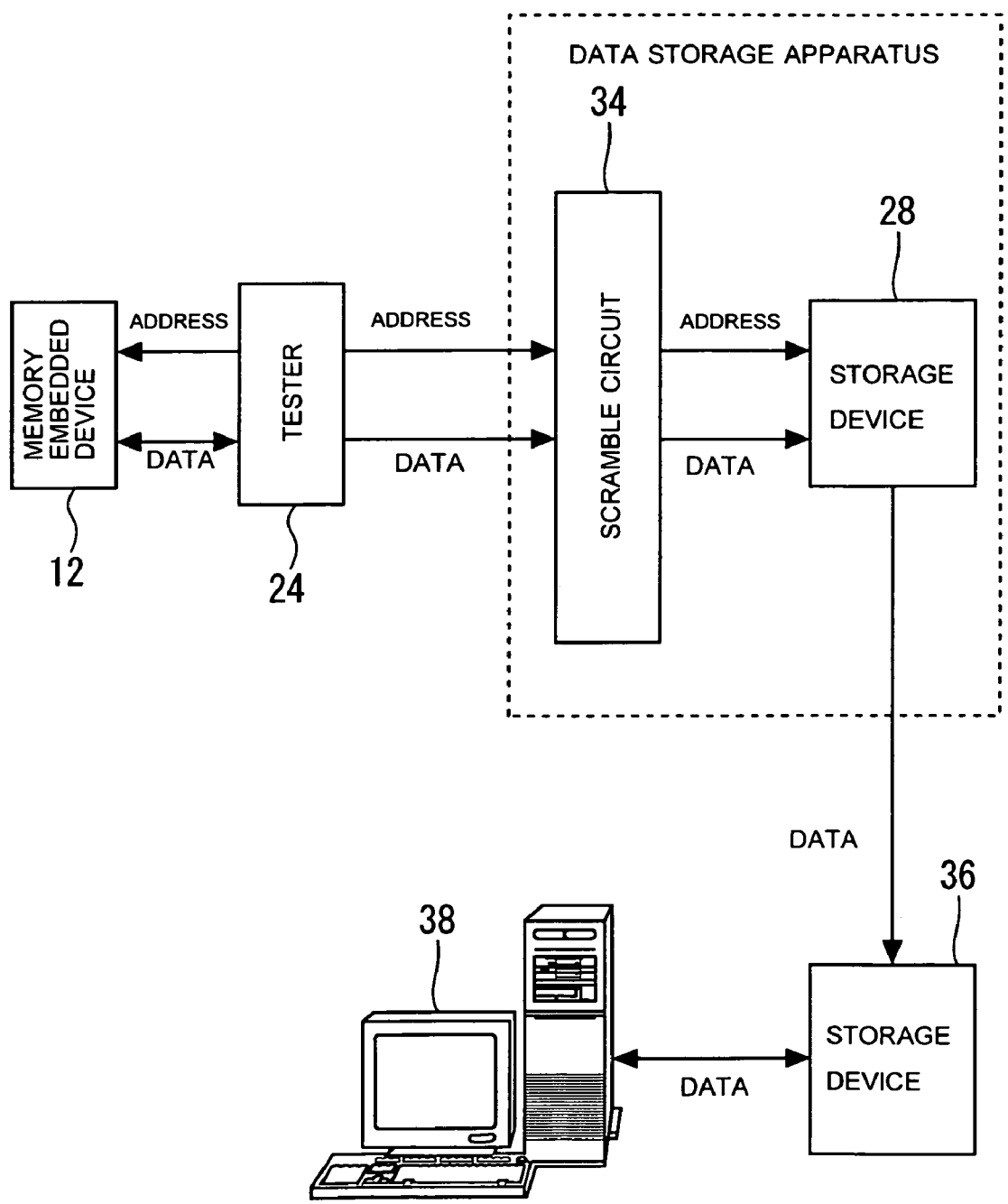
FIG. 1 is a block diagram of a semiconductor analyzing apparatus practiced as a first embodiment of this invention, and a memory-embedded device connected to the apparatus.

Preferred embodiments of this invention will now be described with reference to the accompanying drawings. Throughout the drawings, like reference characters designate like or corresponding parts and their descriptions will be omitted where redundant.

First Embodiment

FIG. 1 is a block diagram of a semiconductor analyzing apparatus practiced as the first embodiment of this invention, and a memory-embedded device 12 connected to the apparatus. The semiconductor analyzing apparatus comprises a tester 24, a scrambling circuit 34, a storage device 28, a second storage circuit 36, and an analyzing computer 38. In the description that follows, the components configured above minus the second storage device 36 and analyzing computer 38 will be referred to as the data measuring apparatus, and the data measuring apparatus minus the tester 24 will be called the data storage apparatus.

The semiconductor analyzing apparatus tests the memory-embedded device 12 and writes information illustratively about memory cell defects found in the device 12 to the storage device 28. The information thus placed in the storage device 28 is transferred in a suitably timed manner to the second storage device 36 for analysis by the analyzing computer 38. The analyzing computer 38 illustratively carries out so-called redundancy remedy analysis, i.e., a type of analysis required to replace defective memory cells with redundant cells prepared in advance.

Figure 2:
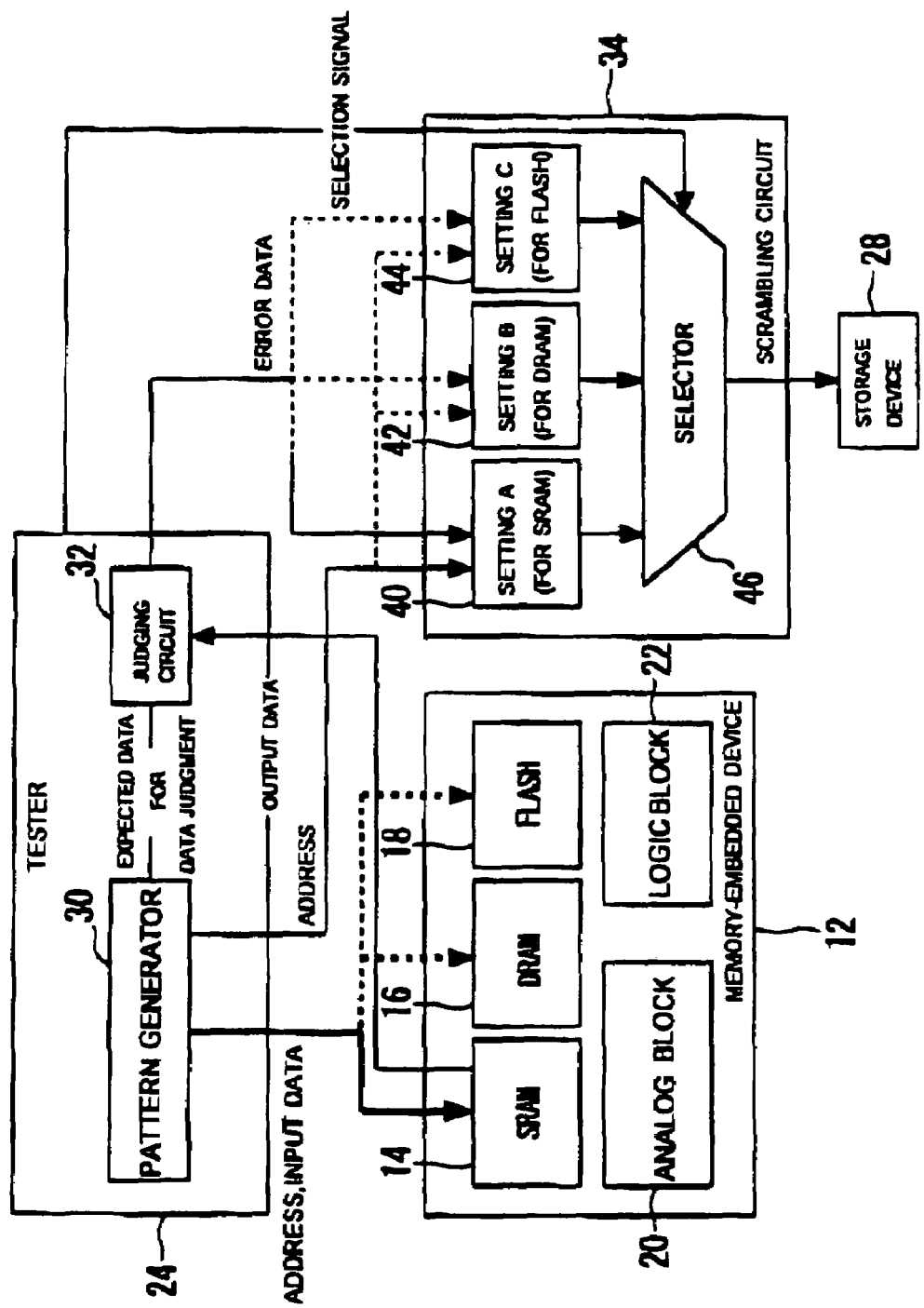
FIG. 2 is a block diagram of a data measuring apparatus included in the first embodiment, and a memory-embedded device connected to the apparatus.

FIG. 2 is a block diagram of the data measuring apparatus included in the first embodiment, and the memory-embedded device 12 connected to the apparatus. The memory-embedded device 12 is a semiconductor device that incorporates a plurality of function blocks, i.e., an SRAM block 14 functioning as an SRAM, a DRAM block 16 acting as a DRAM, a flash block 18 working as a flash memory, an analog block 20 composed of a relevant analog circuit, and a logic block 22 made of a suitable logic circuit.

As mentioned above, the data measuring apparatus includes the tester 24, scrambling circuit 34, and storage device 28. Inside the tester 24 are a pattern generator 30 that generates test patterns necessary for analyzing the memory-embedded device 12, and a judging circuit 32 for judging whether the device 12 is functioning normally.

More specifically, the pattern generator 30 supplies the memory-embedded device 12 with address signals and a variety of input data for determining locations of parts under test. Furthermore, the pattern generator 30 feeds the scrambling circuit 34 with the same addresses sent to the memory-embedded device 12, and supplies expected values to the judging circuit 32 for data judgment purposes.

Relevant data are written as requested by the pattern generator 30 to memory cells constituting the SRAM block 14, DRAM block 16, or flash block 18 in the memory-embedded device 12. The data thus written to the memory cells are retrieved as requested by the pattern generator 30 and sent to the judging circuit 32. In turn, the judging circuit 32 compares the output signal from the memory-embedded device 12 with an expected value for data judgment to see if the device 12 is functioning normally. The result of the judgment is fed to the scrambling circuit 34.

The scrambling circuit 34 converts addresses sent from the pattern generator 30 according to suitable rules, or processes error data or the like from the judging circuit 32 in accordance with relevant rules. The scrambling circuit 34 in the first embodiment comprises three conversion circuits 40, 42 and 44 as well as a selector 46. The scrambling circuit 34 may be formed by combining a plurality of ICs functioning as the conversion circuits 40, 42, 44 and the selector 46, or may be constituted by a single IC integrating these functions.

The conversion circuit 40 offers a setting A for converting addresses and error data regarding the SRAM block 14 into an appropriate format. The conversion circuit 42 has a setting B for converting addresses and error data about the DRAM block 16 into a suitable format. The conversion circuit 44 provides a setting C for converting addresses and error data concerning the flash block 18 into a relevant format.

Address signals from the pattern generator 30 and error data or the like from the judging circuit 32 are fed continuously to the three conversion circuits 40, 42 and 44. After parallel processing within the conversion circuits, the signals and data are sent to three input terminals of the selector 46. The selector 46 is separately supplied with a selection signal in keeping with the type of memory block to be tested. A given selection signal causes the selector 46 to choose and output one of the three signal/data streams from the three conversion circuits 40, 42 and 44.

The signals from the selector 46, i.e., the converted address signals and error data from the conversion circuit 40, 42 or 44 are sent to the storage device 28. As a result, the processed signals and error data are stored at those locations in the storage device 28 which are identified by the converted address signals.

Generally, the multiple memory blocks incorporated in the memory-embedded device 12 are each addressed by a specific addressing method. These memory blocks usually have a different capacity each. This means that if the address signals from the pattern generator 30 are sent unmodified to the storage device 28 so as to identify data storage locations therein, it will be impossible to store efficiently the data about the multiple memory blocks of the different types.

In the first embodiment, the scrambling circuit 34 supplies the storage device 28 with the address signals and error data which have been suitably converted in accordance with the type of the memory block under test. That is, the first embodiment allows information about the plurality of configured memory blocks to be stored efficiently into the memory device 28.

Described below in detail with reference to FIGS. 3A and 3B is how the data about the SRAM block 14, DRAM block 16 and flash block 18 are placed into the storage device 28. FIG. 3A is a two-dimensional view of a typical memory area in the storage device 28. FIG. 3B shows a typically segmented memory area of the memory device 28. It is assumed that the memory device 28 has a capacity of 32 megabits as indicated in FIG. 3A. The memory cells making up the storage device 28 may each be identified by a 25-bit address signal. The bits constituting the address signal are called A0 through A24 from the least significant bit on.

In the example of FIG. 3B, a memory region identified by bit A23=0 (16 megabits) is assigned to the DRAM block; a memory region identified by bits A23=1 and A24=0 (8 megabits) are assigned to the flash block; and a memory region identified by bits A23=1 and A24=1 (8 megabits) is assigned to the SRAM block. When this memory segmentation is in effect, bit A23 is fixed to "0" for the conversion circuit 42 with the setting B for the DRAM block whereas bits A0 through A22 are subject to address signal scrambling. For the conversion circuit 44 with the setting C for the flash block, bit A23 is fixed to "1" and bit A24 is fixed to "0" whereas bits A0 through A22 are subject to address signal scrambling. For the conversion circuit 40 with the setting A for the SRAM block, bits A23 and A24 are fixed to "1" each where as bits A0 through A22 are likewise subject to address signal scrambling. As a result, the error data about the DRAM block 14, DRAM block 16, and flash block 18 are placed into the different segments of the storage device 28.

While the SRAM block 14, DRAM block 16 and flash block 18 of the memory-embedded device 12 are being tested consecutively by the tester 24, the data storage apparatus of the first embodiment causes the selector 46 to select the scrambled results from one of the conversion circuits 40, 42 and 44 and to feed what is selected to the storage circuit 28. The selector 46 is switched at intervals equivalent to a testing cycle of several nanoseconds at most for semiconductor device tests. In this manner, as the memory-embedded device 12 is being tested, the data storage apparatus of the first embodiment switches the selector 46 in synchronized relation with the memory blocks under test so as to store error data about the individual memory blocks.

As described, the data measuring apparatus of the first embodiment continuously tests the memory-embedded device 12 including a plurality of memory blocks of different types while rapidly storing error data or the like about the individual memory blocks into different memory regions assigned to the memory blocks.

Conventional data measuring apparatuses need a certain period of time to switch settings of the scrambling circuit. This means that implementing high-speed data storage requires fixing the scrambling circuit on a single setting. In such a case, it is not always easy to store error data or the like about the multiple memory blocks contained in the memory-embedded device 12 into the storage device 28 in such a manner as to identify the memory blocks individually. To carry out redundancy remedy analysis on the individual memory blocks requires separately recognizing error data about regular cells distinct from error data about redundant cells. If the scrambling circuit is fixed on a single setting, it is not easy to store the error data into the storage device 28 in a manner identifying the stored data individually. Under these circumstances, it is very difficult to generate test patterns when error data or the like are to be stored at a high speed by a conventional data measuring apparatus.

In contrast, the data measuring apparatus of the invention causes the scrambling circuit 34 automatically to change the contents of processing in keeping with the memory block type; there is no need to take into consideration the segmentation of the error data storage area during generation of test patterns. The inventive data measuring apparatus thus provides the benefit of a shortened time in which to develop programs to test the memory-embedded device 12.

Although the first embodiment described above has the selector 46 select one of the conversion circuits 40, 42 and 44 in accordance with the selection signal from the tester, this is not limitative of the invention. Alternatively, the scrambling circuit 34 may be arranged to identify the type of memory logic under test in keeping with the address signal from the pattern generator 30. That is, the selector 46 may be switched on the basis of the address signal from the pattern generator 30.

Second Embodiment

Figures 4A, 4B:
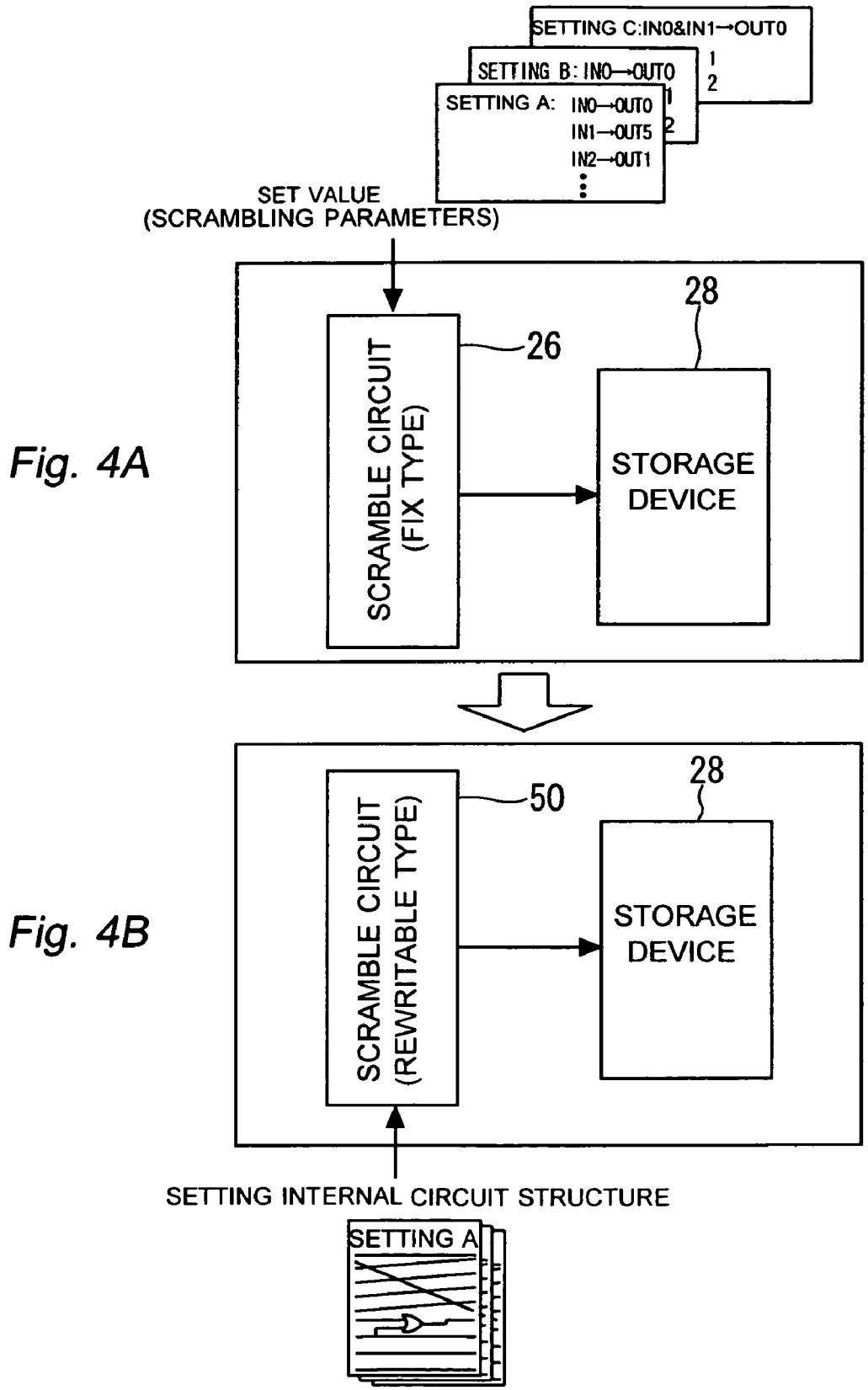
FIGS. 4A and 4B are schematic views of a typical structure of a conventional data storage apparatus and a structure of a data storage apparatus practiced as a second embodiment of this invention.

The second embodiment of this invention will now be described with reference to FIGS. 4A and 4B. FIG. 4A is a schematic view of a typical structure of a conventional data storage apparatus. FIG. 4B illustrates schematically a structure of a data storage apparatus practiced as the second embodiment of the invention. As depicted in FIG. 4A, the conventional data storage apparatus employs a scrambling circuit 26 that alters its settings upon receipt of externally supplied set values (scrambling parameters). This type of scrambling circuit 26 is capable of selecting any one of a number of alternative functions prepared in advance.

As shown in FIG. 4B, the data storage apparatus of the invention utilizes a scrambling circuit 50 made of a rewritable device such as FPGA (field programmable gate array) or CPLD (complex programmable logic device). In the second embodiment, the scrambling circuit 50 is implemented by designing and constituting a circuit structure suitable for scrambling according to specifications of a device under test (semiconductor device) and by writing the circuit structure into the rewritable device.

The rewritable device allows its internal circuit structure to be altered as many times as desired, and may constitute diverse synchronous logic circuits as long as the number of incorporated gates permits. The scrambling circuit 50 is thus capable of repeatedly forming circuit structures optimally fit for a variety of semiconductor devices. In this manner, the second embodiment of the invention constitutes a data measuring apparatus that offers a high level of flexibility and a high degree of versatility in its utilization.

As with the first embodiment, the scrambling circuit 50 of the second embodiment may incorporate a plurality of conversion circuits and a selector. This means that the scrambling circuit 50 provides the same effects as the scrambling circuit 34 of the first embodiment.

Third Embodiment

The third embodiment of this invention will now be described with reference to FIG. 5. FIG. 5 is a block diagram of a data measuring apparatus practiced as the third embodiment, and a memory-embedded device 12 connected to the apparatus. The data measuring apparatus comprises a tester 54 that incorporates an AD converter 52, a scrambling circuit 50 made of a rewritable device, and a storage device 28. In the third embodiment, the scrambling circuit 50 includes a plurality of conversion circuits 56-1 through 56-n and a DSP (digital signal processor) circuit 58.

In the same manner as with the first or the second embodiment of the invention, the data measuring apparatus of the third embodiment places into the storage device 28 error data or the like about memory blocks 14, 16 and 18 furnished in the memory-embedded device 12. The data measuring apparatus of the third embodiment also gets the DSP circuit 58 in the scrambling circuit 50 to process signals from the logic block 22 (see FIG. 2) in the memory-embedded device 12 before storing the processed signals into the storage device 28. Furthermore, the data measuring apparatus of the third embodiment causes the AD converter 52 in the tester 54 and the DSP circuit 58 in the scrambling circuit 50 to process signals from the analog block 20 in the memory-embedded device 12, before storing the processed signals into the storage device 28. In other words, this data measuring apparatus places into the storage device 28 not only data about memory cell defects in the memory blocks 14, 16 and 18 but also the signals output by the analog block 20 and logic block 22 in response to certain inputs.

Conventionally, where memory blocks, an analog block and a logic block were included in a single semiconductor device, the memory blocks were tested by one tester, the analog block was tested by another tester and the logic block by yet another tester. In contrast, the data measuring apparatus of the third embodiment continuously tests the multiple memory blocks 14, 16 and 18, analog block 20 and logic block 22 and writes the results of the tests to the storage device 28 at high speed. That is, this data measuring apparatus tests memory-embedded devices in a significantly efficient manner.

Although the third embodiment described above utilizes a rewritable device in forming the scrambling circuit 50 comprising the conversion circuits 56-1 through 56-n, selector 46 and DSP circuit 58, this is not limitative of the invention. Alternatively, part or all of the scrambling circuit 50 may be constituted by an unwritable, fixed device.

Fourth Embodiment

Figure 6:
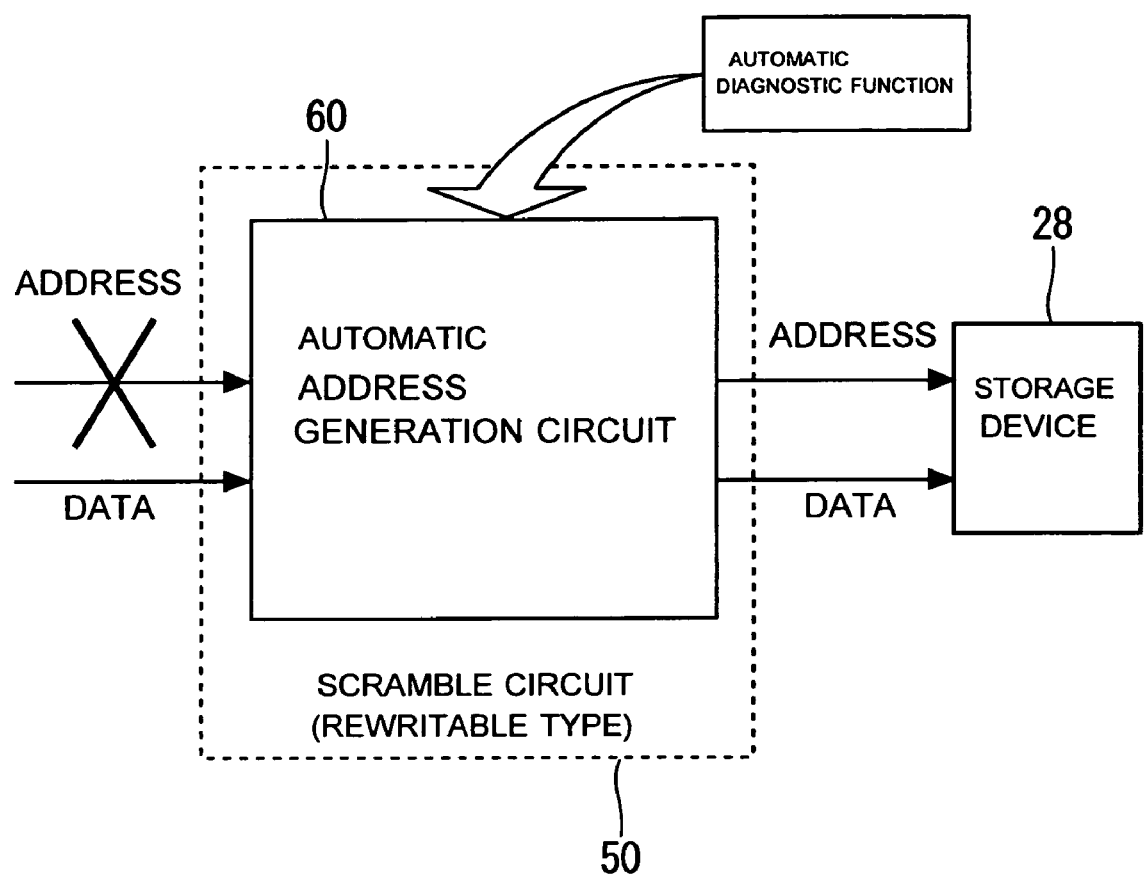
FIG. 6 is a block diagram for explaining a structure of a data storage apparatus practiced as a fourth embodiment of this invention.

The fourth embodiment of this invention will now be described with reference to FIG. 6. FIG. 6 is a block diagram for explaining a structure of a data storage apparatus practiced as the fourth embodiment. The data storage apparatus of the fourth embodiment includes a scrambling circuit 50 made of a rewritable device and a storage device 28. The scrambling circuit 50 in the fourth embodiment includes an automatic address generation circuit 60 that feeds the storage device 28 addresses and data generated automatically in response to externally supplied commands.

Conventionally, in checking to see if the storage device 28 is in a state suitable for accommodating data normally, the storage device 28 was connected to an apparatus different from the scrambling circuit 50. The connected apparatus was arranged to supply the storage device 28 with address signals and data before checking to see if the retrieved contents matched expected values. In contrast, the automatic address generation circuit 60 incorporated in the scrambling circuit 50 allows the data storage apparatus alone to test the storage device 28. That is, the fourth embodiment supplements the scrambling circuit 50 with a diagnostic function to test the storage device 28 automatically, thereby constituting a data storage apparatus capable of rapidly performing simple checks before operation.

Although the fourth embodiment described above employs a rewritable device in forming the scrambling circuit 50 comprising the automatic address generation circuit 60, this is not limitative of the invention. Alternatively, part or all of the scrambling circuit 50 may be constituted by an unwritable, fixed device.

Fifth Embodiment

Figure 7:
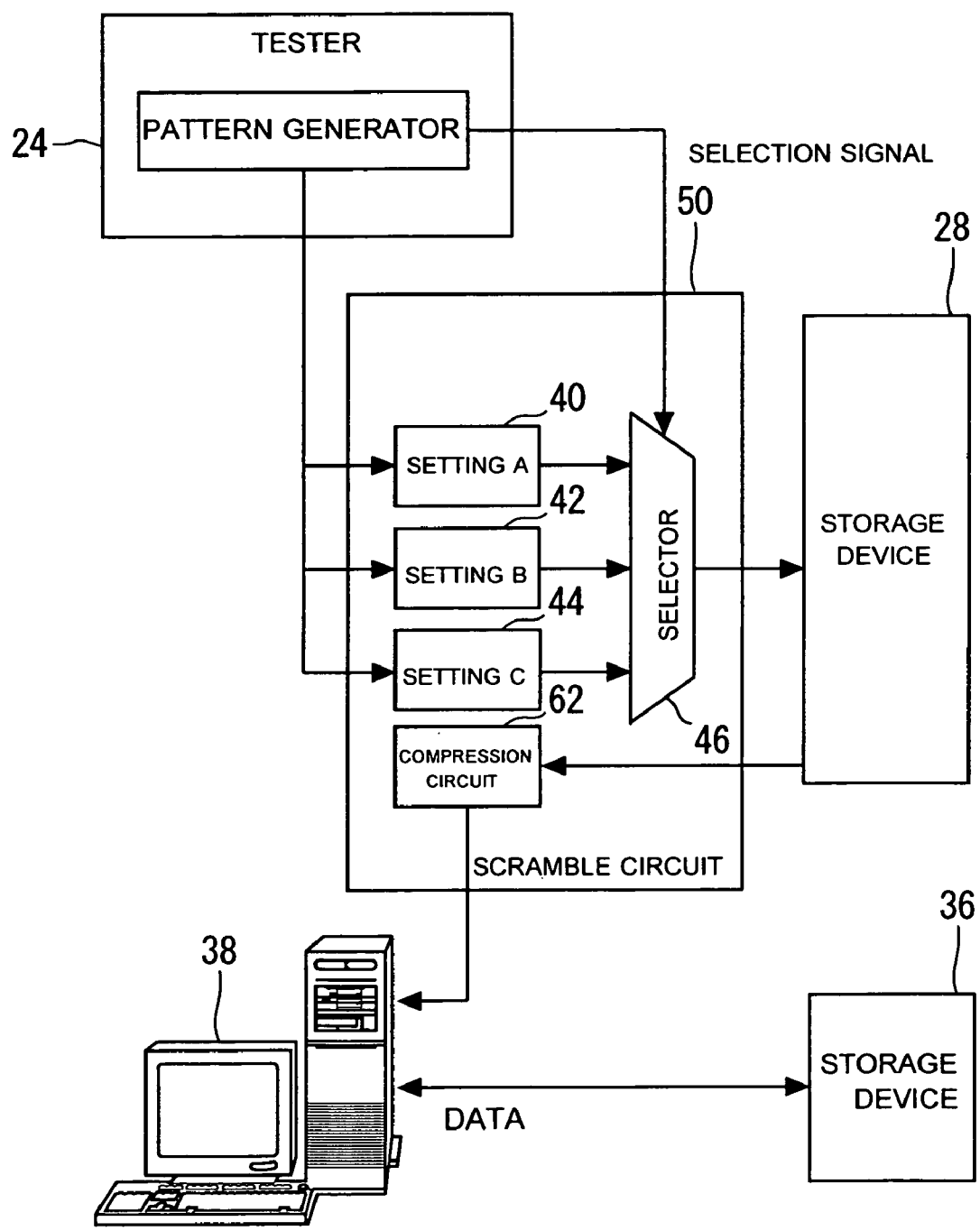
FIG. 7 is a block diagram of a semiconductor analyzing apparatus practiced as a fifth embodiment of this invention.
Figure 8:
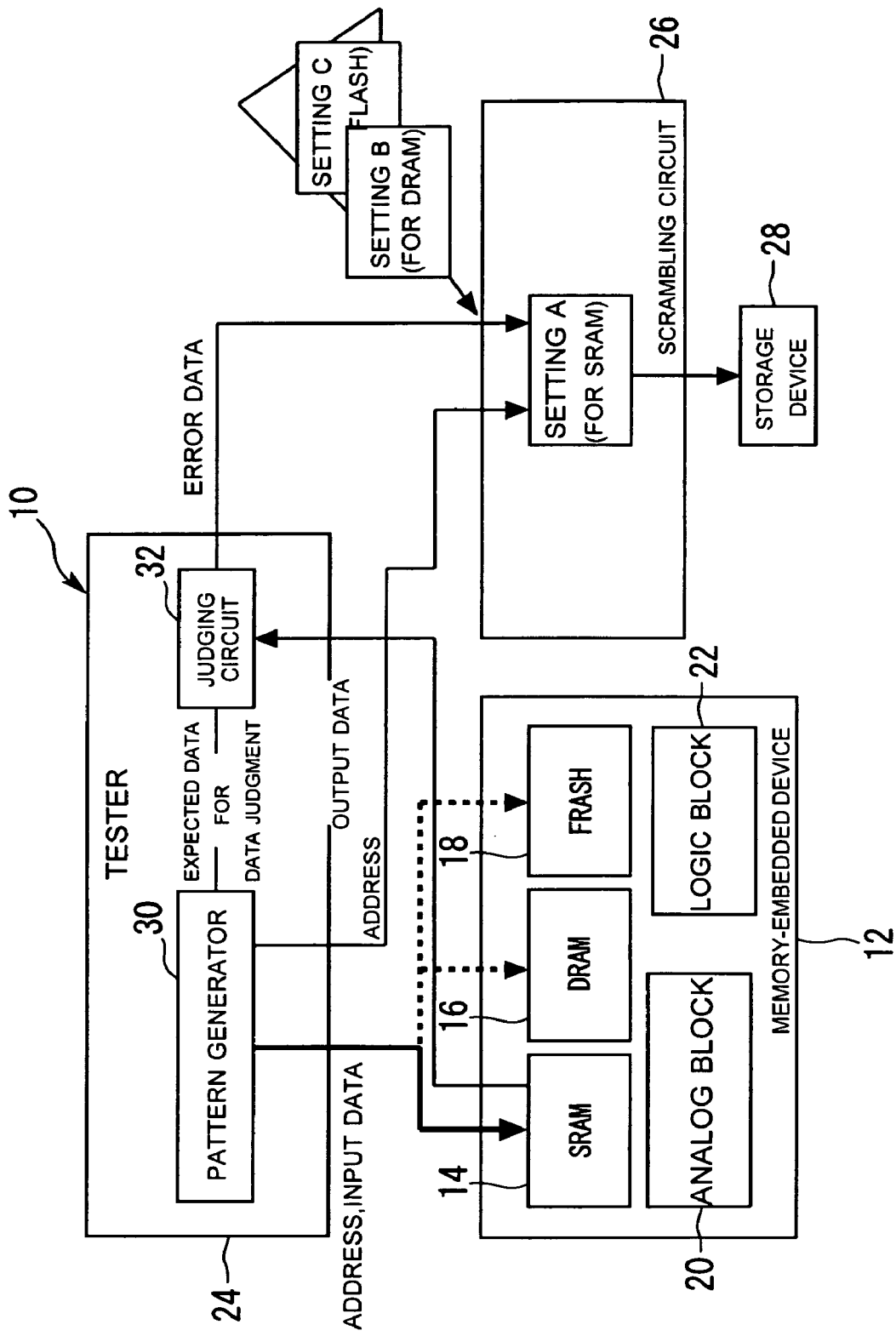
FIG. 8 is a block diagram of a conventional data measuring apparatus and a memory-embedded device connected to the apparatus.

The fifth embodiment of this invention will now be described with reference to FIG. 7. FIG. 7 is a block diagram of a semiconductor analyzing apparatus practiced as the fifth embodiment. In the semiconductor analyzing apparatus of the fifth embodiment, a scrambling circuit 50 made of a rewritable device includes a compression circuit 62. The compression circuit 62 has a hardware structure designed to output data from the storage device 28 in a compressed format usable by the analyzing computer 38.

In the same manner as with any one of the first through the fourth embodiments, the scrambling circuit 50 processes address signals and error data from the tester 24 before feeding what is processed to the storage device 28. The data thus placed in the storage device 28 are retrieved and sent to the analyzing computer 38 in a suitably timed manner. If the storage device 28 has a large capacity, the amount of data to be read by the analyzing computer 38 may become large enough correspondingly to require data compression for filing data to be analyzed.

In a conventional semiconductor analyzing apparatus, the data in the storage device 28 were first read into the analyzing computer 38 and then compressed by software in the computer. With the semiconductor analyzing apparatus of the fifth embodiment, in contrast, the data in the storage device 28 are read into the analyzing computer 38 while being compressed on a hardware basis by the compression circuit 62 inside the scrambling circuit 50. This makes it possible for the fifth embodiment to reduce processing loads on the analyzing computer 38 and thereby to shorten the time required by the computer 38 to analyze data.

Although the fifth embodiment described above uses a rewritable device in constituting the scrambling circuit 50 comprising the automatic address generation circuit 60, this is not limitative of the invention. Alternatively, part or all of the scrambling circuit 50 may be formed by an unwritable, fixed device.

Constituted as described above, this invention offers the following major effects:

According to the first aspect of the present invention, an input signal is processed in parallel by a plurality of conversion circuits, and a selector is used to select one of signals from the conversion circuits for storage into a storage device. When different rules of conversion are brought into effect in response to an input signal, the selector is switched at high speed. The inventive structure thus allows the storage device rapidly to store the varying types of input signals through conversion to suitable formats.

According to the second aspect of the present invention, the scrambling circuit may be formed by a rewritable device. This ensures a high degree of flexibility in the hardware structure of the scrambling circuit, which makes it possible to implement a data measuring apparatus offering greater versatility of use than before.

According to the third aspect of the present invention, the scrambling circuit may include a digital signal processor capable of processing an output signal of an AD converter. This structure allows data included in the analog signal to be converted to a suitable format before being stored into the storage device.

According to the fourth aspect of the present invention, the scrambling circuit may include an automatic address generation circuit. Supplying suitable commands to the scrambling circuit causes the automatic address generation circuit automatically to designate address locations in the storage device. This structure implements a data storage apparatus with a diagnostic function to test a storage device automatically.

According to the fifth aspect of the present invention, the scrambling circuit may include a compression circuit for compressing retrieved data from the storage device into a suitable format. This structure implements a data measuring apparatus for compressing retrieved data from the storage device and for outputting the compressed data.

According to the seventh aspect of the present invention, there is provided a data measuring apparatus comprising the inventive data storage apparatus described above.

Further, the present invention is not limited to these embodiments, but variations and modifications may be made without departing from the scope of the present invention.

The entire disclosure of Japanese Patent Application No. 2000-49150 filed on Feb. 25, 2000 including specification, claims, drawings and summary are incorporated herein by reference in its entirety.

What is claimed is:

1. A data storage apparatus comprising a scrambling circuit for converting a plurality of input signals respectively representing test results for a plurality of elements to a desired format, and a storage device for storing converted data;
   wherein said scrambling circuit includes:
   a plurality of conversion circuits for respectively converting said plurality of input signals according to different rules; and
   a selector for selecting one of signals output by said plurality of conversion circuits and supplying what is selected to said storage device.

2. The data storage apparatus according to claim 1 wherein said scrambling circuit includes a digital signal processor for processing an output signal of an AD converter.

3. The data storage apparatus according to claim 1 wherein said scrambling circuit includes an automatic address generation circuit for automatically generating address signals for identifying storage locations in said storage device in response to externally supplied commands.

4. The data storage apparatus according to claim 1 wherein said scrambling circuit includes a compression circuit for compressing retrieved data from said storage device into a desired format and for outputting the compressed data.

5. A data measuring apparatus comprising:
   a data storage apparatus according to claim 1; and
   a tester for testing a semiconductor device and for supplying said scrambling circuit with results of the testing.

6. A data storage apparatus comprising a scrambling circuit for converting an input signal to a desired format, and a storage device for storing converted data;
   wherein said scrambling circuit is constituted by a rewritable device, and
   said scrambling circuit furher includes:
   a plurality of conversion circuits each converting said input signal according to different rules; and
   a selector for selecting one of signals output by said plurality of conversion circuits and supplying what is selected to said storage device.

7. The data storage apparatus according to claim 6 wherein said scrambling circuit includes a digital signal processor for processing an output signal of an AD converter.

8. The data storage apparatus according to claim 6 wherein said scrambling circuit includes an automatic address generation circuit for automatically generating address signals for identifying storage locations in said storage device in response to externally supplied commands.

9. The data storage apparatus according to claim 6 wherein said scrambling circuit includes a compression circuit for compressing retrieved data from said storage device into a desired format and for outputting the compressed data.

* * * * *